United States Patent
Shiobara

(10) Patent No.: US 9,958,794 B2
(45) Date of Patent: May 1, 2018

(54) MANUFACTURING APPARATUS OF SEMICONDUCTOR DEVICE AND MANAGEMENT METHOD OF MANUFACTURING APPARATUS OF SEMICONDUCTOR DEVICE

(71) Applicant: Kabushiki Kaisha Toshiba, Minato-ku (JP)

(72) Inventor: Eishi Shiobara, Yokkaichi (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 205 days.

(21) Appl. No.: 14/835,854

(22) Filed: Aug. 26, 2015

(65) Prior Publication Data

US 2016/0204040 A1 Jul. 14, 2016

(30) Foreign Application Priority Data

Jan. 8, 2015 (JP) .................................. 2015-002168

(51) Int. Cl.
*G03F 7/20* (2006.01)
*H01L 21/66* (2006.01)

(52) U.S. Cl.
CPC ........ *G03F 7/70925* (2013.01); *G03F 7/2004* (2013.01); *G03F 7/70033* (2013.01); *G03F 7/7085* (2013.01); *G03F 7/70591* (2013.01); *H01L 22/12* (2013.01)

(58) Field of Classification Search
CPC ............... G03F 7/2004; G03F 7/70033; G03F 7/70591; G03F 7/7085; G03F 7/70925
USPC .................................................... 430/30, 331
See application file for complete search history.

(56) References Cited

U.S. PATENT DOCUMENTS

| | | | |
|---|---|---|---|
| 7,256,104 B2 * | 8/2007 | Ito | ........................... H01L 22/12 257/E21.219 |
| 7,473,916 B2 | 1/2009 | Singh | |
| 2004/0207800 A1 | 10/2004 | Hiruma et al. | |
| 2011/0102755 A1 | 5/2011 | Kawamura | |
| 2014/0023970 A1 | 1/2014 | Fu et al. | |
| 2015/0331323 A1 | 11/2015 | Wang et al. | |

FOREIGN PATENT DOCUMENTS

| | | |
|---|---|---|
| CN | 1475313 A | 2/2004 |
| JP | 2005-156191 A | 6/2005 |
| JP | 4205558 | 1/2009 |
| JP | 2011-100840 | 5/2011 |
| JP | 4852395 | 1/2012 |
| KR | 1991-0003776 A | 2/1991 |
| KR | 10-2005-0099670 A | 10/2005 |
| TW | 201245887 A1 | 11/2012 |
| TW | 201435511 A | 9/2014 |

* cited by examiner

*Primary Examiner* — Christopher G Young
(74) *Attorney, Agent, or Firm* — Oblon, McClelland, Maier & Neustadt, L.L.P.

(57) ABSTRACT

According to one embodiment, a management method of a manufacturing apparatus of a semiconductor device, the method includes measuring a weight of a pre-exposure substrate including a semiconductor substrate and a resist film provided on the semiconductor substrate, performing an exposure process for the resist film, measuring a weight of a post-exposure substrate including the semiconductor substrate and the resist film after the exposure process is performed, and acquiring a weight difference between the weight of the pre-exposure substrate and the weight of the post-exposure substrate.

8 Claims, 5 Drawing Sheets

MANUFACTURING APPARATUS OF SEMICONDUCTOR DEVICE AND MANAGEMENT METHOD OF MANUFACTURING APPARATUS OF SEMICONDUCTOR DEVICE

CROSS-REFERENCE TO RELATED APPLICATIONS

This application is based upon and claims the benefit of priority from Japanese Patent Application No. 2015-002168, filed Jan. 8, 2015, the entire contents of which are incorporated herein by reference.

FIELD

Embodiments described herein relate generally to a manufacturing apparatus of semiconductor device and a management method of a manufacturing apparatus of semiconductor device.

BACKGROUND

During a lithography process in the manufacture of semiconductor devices, an exposure process for a resist is performed. In this exposure process, outgas from the resist adheres to an optical system of an exposure apparatus and causes contamination. Such contamination makes it difficult to perform a suitable exposure process. Therefore, cleaning of the optical system is required to remove the contamination.

However, since it is difficult to accurately determine the degree of contamination, time to start cleaning is also difficult to determine. If cleaning is started too late, a suitable exposure process cannot be performed. Or, if cleaning is started too soon, operation performance of the exposure apparatus decreases.

Therefore, a method and an apparatus which can accurately determine the degree of the contamination are required.

DETAILED DESCRIPTION

In general, according to one embodiment, a management method of a manufacturing apparatus of a semiconductor device, the method includes: measuring a weight of a pre-exposure substrate including a semiconductor substrate and a resist film provided on the semiconductor substrate; performing an exposure process for the resist film; measuring a weight of a post-exposure substrate including the semiconductor substrate and the resist film after the exposure process is performed; and acquiring a weight difference between the weight of the pre-exposure substrate and the weight of the post-exposure substrate.

Hereinafter, embodiments will be described with reference to accompanying drawings.

Figure 1:
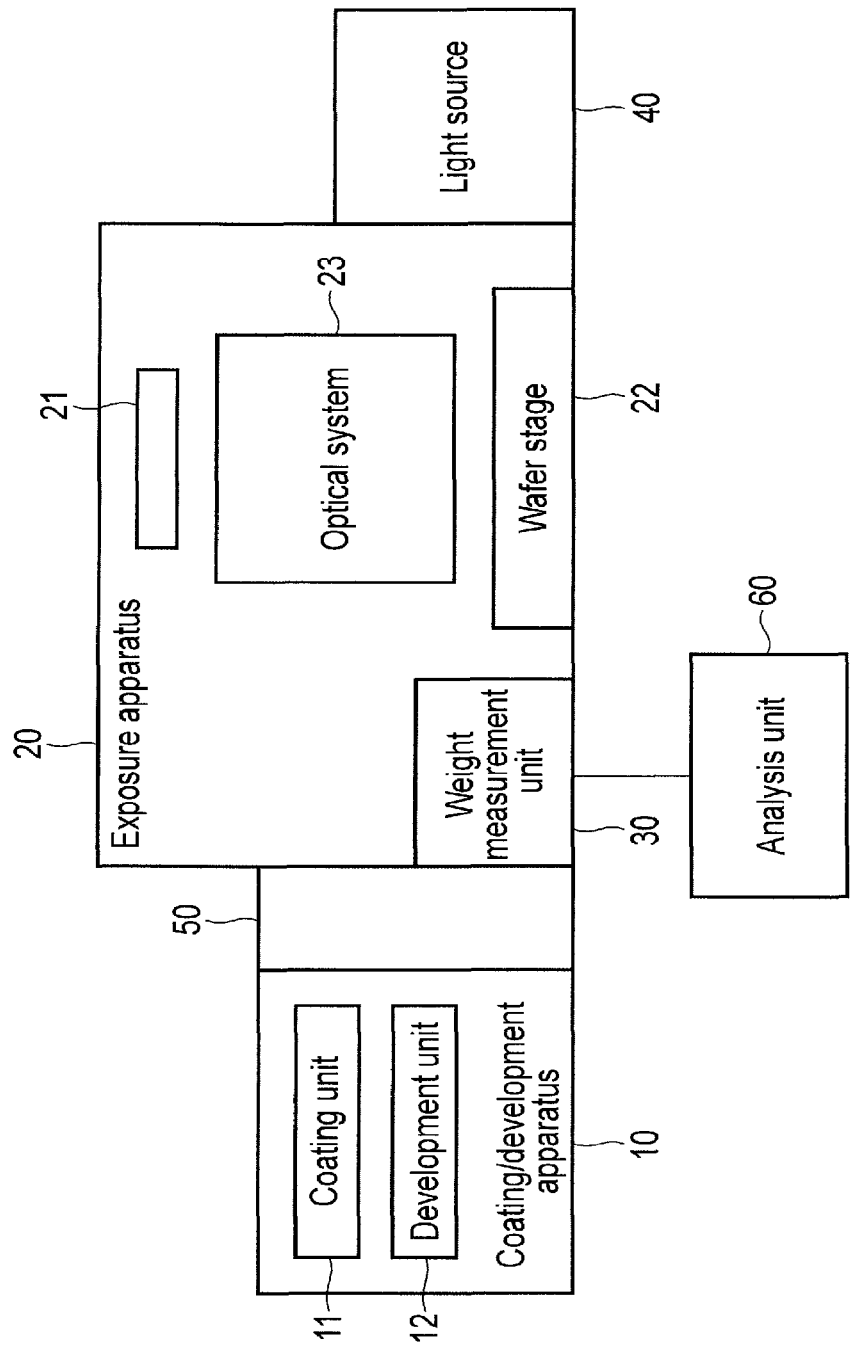
FIG. 1 schematically shows a basic structure of a manufacturing apparatus of semiconductor device of an embodiment.

FIG. 1 schematically shows a basic structure of a manufacturing apparatus of a semiconductor device of the present embodiment.

The apparatus shown in FIG. 1 includes a coating/development apparatus 10, exposure apparatus 20, weight measurement unit 30, light source 40, interface 50, and analysis unit 60.

The coating/development apparatus 10 includes a coating unit 11 and development unit 12. The coating unit 11 applies a photo resist on a semiconductor substrate (semiconductor wafer). Note that the semiconductor substrate (semiconductor wafer) descried here includes a semiconductor substrate (semiconductor wafer) main body along with patterns used to form transistor, interconnection, and the like. The development unit 12 performs a development for the resist film after the exposure process.

The exposure apparatus 20 performs the exposure process for the resist film provided on the semiconductor substrate. The exposure apparatus 20 includes a reticle placement part 21 on which reticle is placed, wafer stage 22 on which the semiconductor wafer is placed, and optical system 23 which transfers the pattern on the reticle to the semiconductor wafer. In the present embodiment, the optical system 23 is a reflective optical system for extreme ultra violet (EUV) exposure.

The weight measurement unit 30 is incorporated into the exposure apparatus 20 to measure a weight of the substrate including the semiconductor substrate (semiconductor wafer). Specifically, the weight measurement unit 30 is provided inside the exposure apparatus 20. The weight measurement unit 30 measures the weight of the substrate before the exposure (pre-exposure substrate) including the semiconductor substrate and the resist film provided on the semiconductor substrate, and the weight of the substrate after the exposure (post-exposure substrate) including the semiconductor substrate and the resist film to which the exposure process has been performed by the exposure apparatus 20.

The light source 40 generates exposure light used in the exposure apparatus 20. In the present embodiment, the light source 40 is a EUV light source.

The interface 50 is provided between the coating/development apparatus 10 and the exposure apparatus 20. The semiconductor wafer is moved between the coating/development apparatus 10 and the exposure apparatus 20 through the interface 50.

The analysis unit 60 is connected to the weight measurement unit 30. The analysis unit 60 acquires a weight difference between the substrate before the exposure and the substrate after the exposure. Furthermore, the analysis unit 60 acquires a film thickness of a contamination film produced by the exposure process based on the acquired weight difference. Furthermore, the analysis unit 60 adds the film thickness of the contamination film to a total value (total addition value) of contamination film thicknesses which have already been acquired. Furthermore, the analysis unit 60 compares the total value of contamination film thicknesses to a reference film thickness, and if the total value of contamination film thicknesses is greater than the reference film thickness, determines that cleaning of the optical system 23 should be performed.

Figure 2:
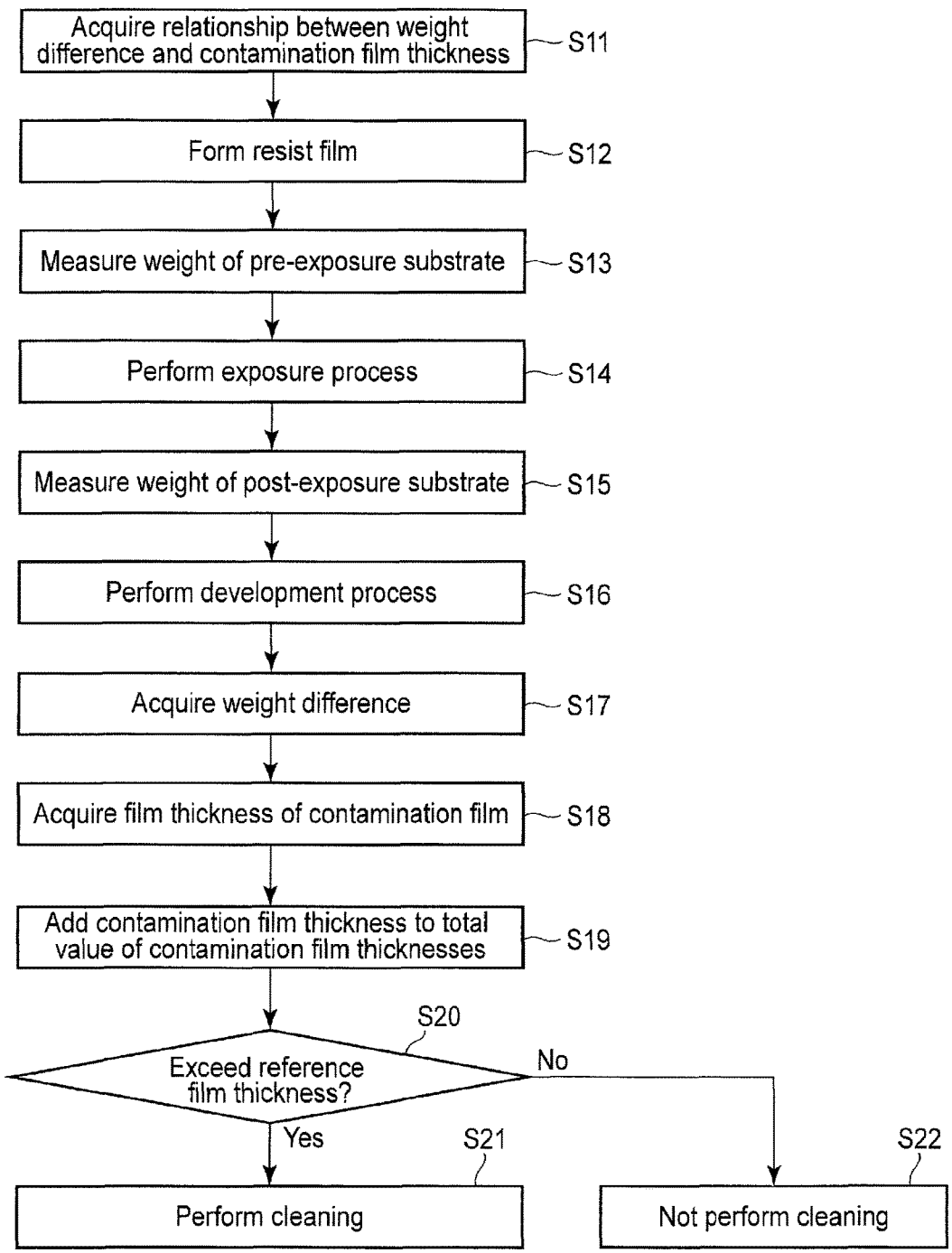
FIG. 2 is a flowchart showing a management method of the manufacturing apparatus of semiconductor device of the embodiment.

FIG. 2 is a flowchart showing a management method of the manufacturing apparatus of semiconductor device of the present embodiment.

Initially, a relationship between a weight difference between substrate before exposure and substrate after exposure and a contamination film thickness is derived in advance (S11). This step is now explained.

When exposure light is irradiated onto a resist film formed on a semiconductor substrate (semiconductor wafer), outgas is generated from the resist film. Outgas adheres to an optical system of an exposure apparatus, and a contamination film is formed on the optical system. That is, a contamination film is formed on surfaces of a lens and a mirror which are components of the optical system.

The contamination film formed by outgas can be evaluated by a witness sample (WS) method which is well-known. A witness sample is a sample imitating a reflective mirror of an optical system of an exposure apparatus. In the WS method, outgas generated from the resist film by the exposure light is deposited on the witness sample and a thickness of the deposit film is determined. As the exposure light, energy ray such as EUV light and electron ray is used. The thickness of the deposit film on the witness sample can be used as an index of cleaning time of the optical system.

In the present embodiment, multiple contamination films having different thicknesses are formed on the witness sample. Specifically, multiple contamination films having different thicknesses are formed by changing an amount of energy ray irradiation and an area of irradiation. Furthermore, in the present embodiment, a weight of wafer (semiconductor wafer and resist film) is measured before and after the irradiation of the energy ray onto the resist film. Then, a weight difference between the wafer before the energy ray irradiation and the wafer after the energy ray irradiation is acquired.

Figure 3:
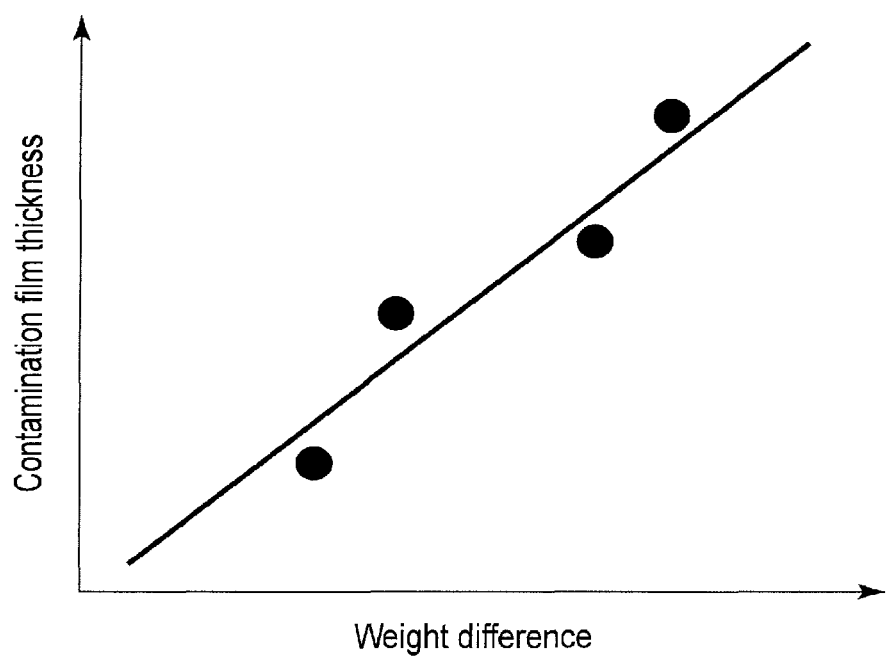
FIG. 3 shows an example of a relationship between a weight difference and a contamination film thickness.

FIG. 3 shows an example of a relationship between a weight difference of the wafer (substrate) and a contamination film thickness. As shown in FIG. 3, the contamination film thickness is in proportion to the weight difference. Thus, by acquiring the weight difference of the wafer (substrate) before and after the energy irradiation, the film thickness of the contamination film can be estimated.

Note that, if different kinds of resists are used in the same exposure apparatus, a relationship between a weight difference of a wafer (substrate) and a film thickness of a contamination film is acquired in advance for each resist.

As can be understood from the above, the weight difference between the substrate before the exposure (wafer before the exposure) and the substrate after the exposure (wafer after the exposure) and the film thickness of the contamination film on the witness sample is acquired. The acquired relationship is stored in the analysis unit 60 in FIG. 1.

In the actual manufacturing process of the semiconductor device, the contamination film thickness is managed as follows based on the above-explained relationship between the weight difference and the contamination film thickness.

Figure 4:
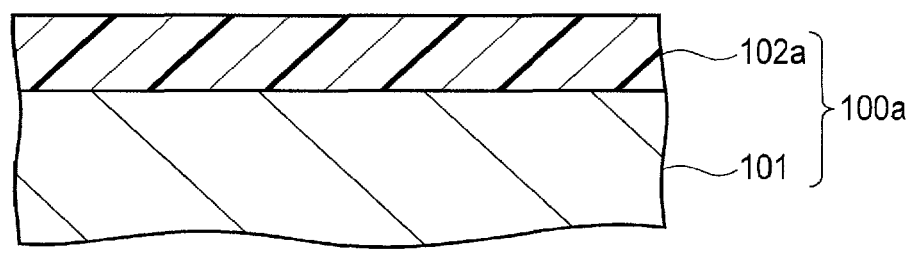
FIG. 4 is a cross-sectional view which schematically shows the structure of a pre-exposure substrate.

Firstly, the coating unit 11 applies a photo resist on a semiconductor substrate (semiconductor wafer). Furthermore, soft baking of the photo resist is carried out. A resist film is formed on the semiconductor substrate (semiconductor wafer) (S12). The semiconductor substrate (semiconductor wafer) explained here includes a semiconductor substrate (semiconductor wafer) main body along with patterns used to form transistor, interconnection, and the like. Through the above process, a pre-exposure substrate 100a including a semiconductor substrate 101 and a resist film 102a provided on the semiconductor substrate 101 are obtained as shown in FIG. 4.

Secondly, the pre-exposure substrate 100a is conveyed to an exposure apparatus 20 via an interface 50. Then, a weight of the pre-exposure substrate is measured by a weight measurement unit 30 incorporated into the exposure apparatus 20 (S13). A measurement result is sent to an analysis unit 60.

Thirdly, an exposure process is performed for the resist film 102a in the exposure apparatus 20 (S14). That is, EUV light is irradiated to the resist film 102a via reticle (EUV mask) having a semiconductor circuit pattern to transfer the pattern onto the resist film 102a.

In the exposure process explained above, a photochemical reaction of a photosensitizer occurs in the resist film 102a and outgas is generated from the resist film 102a. Mote specifically, the irradiated EUV light generates secondary electrons in a chemically amplified resist, and the generated secondary electrons decompose a photoacid generator and generate acid. The acid generated here decomposes a dissolution inhibitor in base polymer of the resist film. Generally, decomposition of the dissolution inhibitor is promoted in an acid catalytic reaction in a heating process after the exposure; however, the dissolution inhibitor is partly decomposed during the exposure. Such decomposition products from the photoacid generator and dissolution inhibitor diffuse in the resist film and generate outgas.

Figure 5:
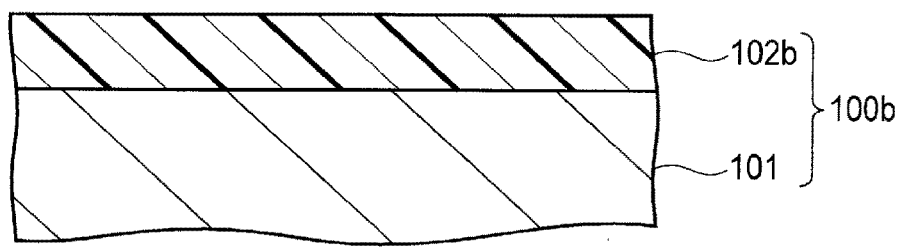
FIG. 5 is a cross-sectional view which schematically shows the structure of a post-exposure substrate.

Consequently, as shown in FIG. 5, a post-exposure substrate 100b including the semiconductor substrate 101 and a resist film 102b after the exposure process are obtained.

Then, a weight of the post-exposure substrate 100b is measured in the weight measurement unit 30 (S15). A measurement result is sent to the analysis unit 60.

Then, the post-exposure substrate 100b is conveyed to a coating/development apparatus 10 via the interface 50. After post-exposure baking is performed for the post-exposure substrate 100b, development process is performed in a development unit 12 (S16). Then, post baking is performed as needed and a resist pattern is obtained.

Then, a weight difference between the pre-exposure substrate 100a and the post-exposure substrate 100b is acquired in the analysis unit 60 (S17).

Then, a film thickness of the contamination film produced in the exposure process is acquired based on the weight difference (S18). A relationship between the weight difference and the contamination film thickness has already been acquired in step S11. Therefore, the film thickness of the contamination film can be estimated from the weight difference obtained from step S17.

Then, the film thickness obtained in step S18 is added to the total value (total addition value) of contamination film thicknesses which have already been acquired until that time (S19). Now, this process is detailed below.

In the weight measurement unit 30, a weight of a pre-exposure substrate and a weight of a post-exposure substrate are measured every time the exposure process is performed in the exposure apparatus 20. Furthermore, in the analysis unit 60, a contamination film thickness is acquired from the weight difference between the pre-exposure substrate and the post-exposure substrate every time the exposure process is performed. The contamination film thicknesses acquired in respective exposure processes are added up in the analysis unit 60. Therefore, the analysis unit 60 stores a total value of contamination film thicknesses already acquired. In the present step, the contamination film thickness obtained in step S18 is added to the total value of contamination film thicknesses already acquired. As a result, an updated total value of contamination film thicknesses is obtained. Thus, a total film thickness of the contamination film deposited on the optical system 23 can be estimated.

Figure 6:
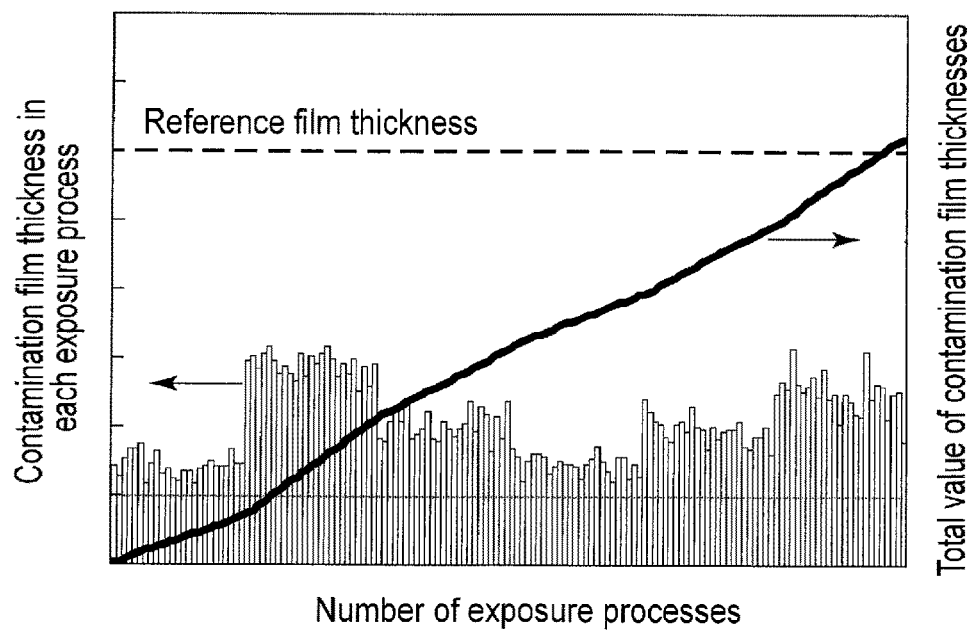
FIG. 6 shows an example of a relationship between the number of exposure processes and a total value of contamination film thicknesses.

FIG. 6 shows an example of a relationship between the number of exposure processes and a total value of contamination film thicknesses. Bars indicate contamination film thicknesses measured in respective exposure processes and a line shows a total value of contamination film thicknesses. Note that a scale of vertical axis of the bar graph and a scale of a vertical axis of the line graph are different. As can be understood from FIG. 6, the total value of contamination film thicknesses increase when the number of the exposure processes increases.

Next, the updated total value of contamination film thicknesses obtained in step S19 is determined whether or not it exceeds a reference film thickness (S20).

If the total value of contamination film thicknesses is determined to be more than the reference film thickness in step S20, the analysis unit 60 determines that cleaning of the optical system (lens and mirror) 23 of the exposure apparatus 20 should be performed (S21).

If the total value of contamination film thicknesses is determined to be less than the reference film thickness in step S20, the analysis unit 60 determines that cleaning of the optical system (lens and mirror) 23 of the exposure apparatus 20 is unnecessary (S22).

The necessity of cleaning is determined as above and the cleaning is performed upon determination of cleaning necessary.

As can be understood from the above, in the present embodiment, a contamination film thickness is estimated based on a weight difference between the pre-exposure substrate 100a and the post-exposure substrate 100b. Therefore, by acquiring a relationship between the weight difference and the contamination film thickness in advance, the film thickness of the contamination film can be determined accurately. As a result, a cleaning time of the optical system 23 of the exposure apparatus 20 can be determined accurately using the total value of the contamination film thicknesses, and the cleaning can be performed at precise timing.

Furthermore, in the present embodiment, the cleaning time is determined from the total value of the contamination film thicknesses, not from a total value of weight differences. Normally, the degree of contamination depends on the contamination film thickness, and thus, by acquiring the total value of the contamination film thicknesses, the cleaning time can be determined precisely. Furthermore, in the present embodiment, a relationship between the weight difference and the contamination film thickness is acquired in advance for each kind of resist, the total value of the contamination film thicknesses can be acquired securely even if different kinds of resist films are deposited.

Furthermore, in the present embodiment, since the weight measurement unit 30 is incorporated in the system of the manufacturing apparatus, the weight measurement can be performed efficiently. Furthermore, since the weight measurement unit 30 is incorporated in the exposure apparatus 20, the structure other than the exposure apparatus 20 can be simplified.

Figure 7:
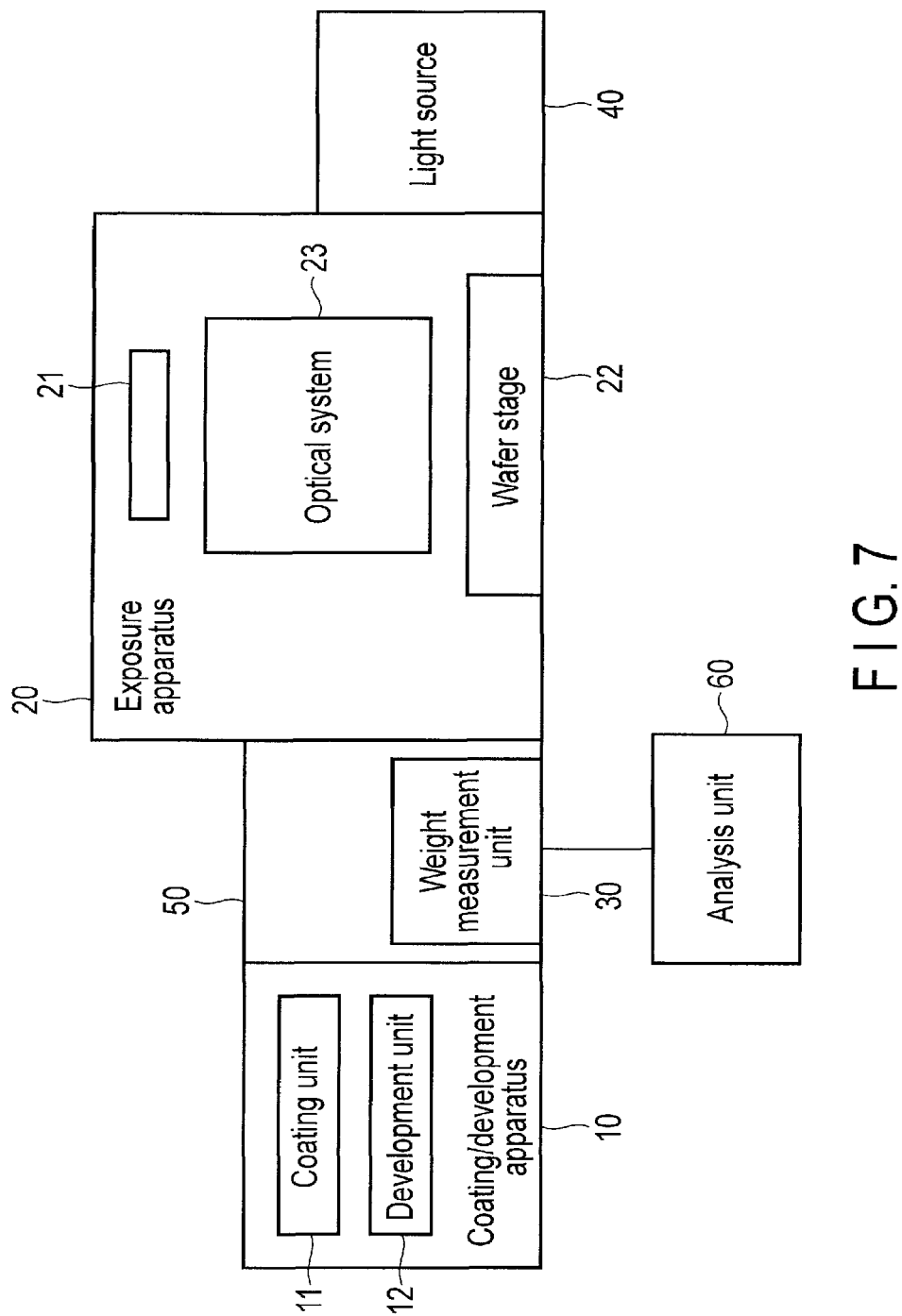
FIG. 7 schematically shows a basic structure of a manufacturing apparatus of semiconductor device of a variation of the embodiment.

FIG. 7 schematically shows a basic structure of a manufacturing apparatus of semiconductor device of a variation of the present embodiment. The basic structure is the same as that of the embodiment shown in FIG. 1. Thus, structural elements corresponding to those shown in FIG. 1 are referred to by the same reference numbers.

In the above embodiment, the weight measurement unit 30 is incorporated in the exposure apparatus 20. In this variation, the weight measurement unit 30 is incorporated in the interface 50.

The basic operation of this variation is the same as that in the above-described embodiment; however, since the weight measurement unit 30 is incorporated in the interface 50 in this variation, a weight of the pre-exposure substrate 100a is measured before being conveyed to the exposure apparatus 20 and a weight of the post-exposure substrate 100b is measured after being removed from the exposure apparatus 20.

Advantages substantially the same as those of the above-described embodiment are achievable in this variation. Additionally, since the weight measurement unit 30 is incorporated in the interface 50 in this variation, apparatuses other than the interface 50, especially the exposure apparatus 20 can be simplified structurally.

Note that, in the above-described embodiment and variation, a single or a plurality of measurement devices can be used as the weight measurement unit 30. Here, a single measurement device should preferably used for a single substrate to measure both weights before and after the exposure process. By using the same measurement device, a weight difference can be acquired with higher accuracy.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A management method of a manufacturing apparatus of a semiconductor device, the method comprising:
   measuring a weight of a pre-exposure substrate including a semiconductor substrate and a resist film provided on the semiconductor substrate;
   performing an exposure process for the resist film;
   measuring a weight of a post-exposure substrate including the semiconductor substrate and the resist film after the exposure process is performed;
   acquiring a weight difference between the weight of the pre-exposure substrate and the weight of the post-exposure substrate; and
   acquiring a film thickness of a contamination film produced by the exposure process based on the weight difference.

2. The method of claim 1, further comprising adding the film thickness of the contamination film to a total value of contamination film thicknesses already acquired.

3. The method of claim 2, further comprising comparing an updated total value of contamination film thicknesses to a reference film thickness, the updated total value of contamination film thicknesses being acquired by adding the film thickness of the contamination film to the total value of contamination film thicknesses already acquired.

4. The method of claim 3, further comprising determining that an optical system of an exposure apparatus which performs the exposure process is to be cleaned if the updated total value of contamination film thicknesses is greater than the reference film thickness.

5. The method of claim 1, wherein the film thickness of the contamination film produced by the exposure process is acquired based on a relationship between a film thickness of a contamination film and a weight difference between a weight of a pre-exposure substrate and a weight of a post-exposure substrate, the relationship being acquired in advance.

6. The method of claim 5, wherein the relationship is acquired in advance for each kind of resist to be used.

7. The method of claim 1, wherein the weight of the pre-exposure substrate and the weight of the post-exposure substrate are measured by a weight measurement unit incorporated in an exposure apparatus which performs the exposure process.

8. The method of claim 1, wherein the exposure process is performed using a EUV light source.

* * * * *